United States Patent
Pitwon

(10) Patent No.: US 9,247,638 B2
(45) Date of Patent: Jan. 26, 2016

(54) OPTICAL PRINTED CIRCUIT BOARD AND A METHOD OF MANUFACTURING AN OPTICAL PRINTED CIRCUIT BOARD

(75) Inventor: Richard C. A. Pitwon, Fareham (GB)

(73) Assignee: Xyratex Technology Limited, Havant (GB)

( * ) Notice: Subject to any disclaimer, the term of this patent is extended or adjusted under 35 U.S.C. 154(b) by 1063 days.

(21) Appl. No.: 12/943,718

(22) Filed: Nov. 10, 2010

(65) Prior Publication Data

US 2012/0114280 A1    May 10, 2012

(51) Int. Cl.
*G02B 6/42* (2006.01)
*H05K 1/02* (2006.01)

(52) U.S. Cl.
CPC ............ *H05K 1/0274* (2013.01); *G02B 6/4212* (2013.01); *G02B 6/4214* (2013.01); *G02B 6/4249* (2013.01); *G02B 6/4292* (2013.01); *Y10T 29/49124* (2015.01)

(58) Field of Classification Search
CPC .......................... G02B 6/4494; G02B 6/12166
USPC ....................................... 385/14, 15
See application file for complete search history.

(56) References Cited

U.S. PATENT DOCUMENTS

| | | | | |
|---|---|---|---|---|
| 5,296,296 | A * | 3/1994 | Haghighat et al. ............ | 428/426 |
| 6,436,613 | B1 * | 8/2002 | Fallahi et al. ................ | 430/321 |
| 6,555,193 | B1 * | 4/2003 | Cupina ........................ | 428/40.1 |
| 6,879,423 | B2 * | 4/2005 | Kim et al. ...................... | 359/245 |
| 7,087,179 | B2 * | 8/2006 | Mak et al. ........................ | 216/24 |
| 7,936,953 | B2 * | 5/2011 | Johnson et al. ................. | 385/14 |
| 2009/0067799 | A1 * | 3/2009 | Nakane ........................ | 385/131 |
| 2009/0162004 | A1 | 6/2009 | Johnson et al. | |
| 2009/0214158 | A1 * | 8/2009 | Lee et al. ........................ | 385/14 |

FOREIGN PATENT DOCUMENTS

JP    59024806 A   *   2/1984

\* cited by examiner

*Primary Examiner* — Ryan Lepisto
*Assistant Examiner* — Mary El Shammaa
(74) *Attorney, Agent, or Firm* — Mueting, Raasch & Gebhardt, P.A.

(57) ABSTRACT

A method of manufacturing an optical printed circuit board and an optical printed circuit board. The method includes providing a support layer having one or more optical waveguides formed on the support layer, the waveguides having exposed interfaces. A film is provided on one or more of the exposed interfaces, wherein the film has a smoother outer surface than the waveguide interface.

21 Claims, 16 Drawing Sheets

OPTICAL PRINTED CIRCUIT BOARD AND A METHOD OF MANUFACTURING AN OPTICAL PRINTED CIRCUIT BOARD

FIELD

The present invention relates to an optical printed circuit board and a method of manufacturing an optical printed circuit board.

BACKGROUND

Optical printed circuit board technologies have a wide range of applications which take advantage of their ability to support high bandwidths and other known benefits. For example, it is known to use optical PCBs in aerospace vehicles to convey sensor information to primary processing nodes, or as optical links in large passenger planes to convey sensor and multimedia information across the plane (e.g. video on demand for passengers). They can also be used in automotive applications for the distribution of sensor and media information in cars. They can be used in high performance computing to accommodate huge bandwidth densities around processor nodes, or in a telecommunications setting to accommodate the huge bandwidth densities for embedded optical channels at network nodes. It is also contemplated that optical printed circuit boards may be advantageous in data storage technologies, for example for signal communications in the back planes of disk drive storage enclosures.

Optical printed circuit boards (PCBs) have optical waveguides that are used for the transmission of light signals between components, as well as or instead of conventional copper conductors. Typically, an optical PCB consists of a base or support layer. In areas of the optical PCB where optical waveguides are required, a lower optical cladding layer is provided usually of uniform thickness. On top of this, a layer of optical core material is laid down. The optical core material has a higher refractive index than the cladding layer and will eventually form one or more optical waveguides on the optical PCB.

In a known process used for making optical PCBs, the core layer is laid down in liquid form, e.g. as a curable liquid polymer. A photolithographic mask having a pattern corresponding to the desired shape of the waveguides is arranged over the liquid polymer and the entire resultant structure is then irradiated with electromagnetic radiation of suitable wavelength. Thus, in regions of the mask which are open, the liquid polymer is cured. In other regions, the polymer remains liquid. The mask is removed and the remaining liquid polymer can be washed away with an appropriate solvent known as a "developer" leaving the desired pattern of optical waveguides. Alternatively a dry film optical polymer can be used instead of a liquid polymer.

The remaining core material is typically arranged in patterns of channels which are arranged in some manner so as to be able to couple optical signals between components on the optical PCB when the components are arranged thereon. Last, an upper cladding layer is laid down, so that the channels of core material are completely surrounded by cladding material, and therefore are able to function as optical waveguides. FIG. 1 shows a schematic representation of such a conventional optical PCB and FIG. 2 shows a sectional view of the same optical PCB.

The PCB 2 comprises a base or support layer 4 upon which is arranged a lower cladding layer 6. A plurality of optical waveguides 8 are arranged on the lower cladding layer 6 and have arranged around them an upper cladding layer 10. Thus, the optical waveguides are entirely surrounded by cladding material of the upper cladding layer 10 and the lower cladding layer 6. Typically, the height H of the optical waveguides will be of the order 50 to 70 μm. The width W of each of the optical waveguides is typically of the order 50 to 100 μm. The waveguides can be fabricated to very high accuracy, typically of the order of <1 μm. High accuracy is an important requirement of any optical waveguide structure.

In order to couple optical signals into the waveguides 8, optical components such as transmitters, receivers, 45° mirrors and other optical waveguides, the components must be aligned with respect to the optical waveguide input interfaces or facets 12 with a high alignment tolerance. It is also important to achieve a smooth and normally planar interface at the facets 12 to avoid scattering of light entering or exiting the waveguide 8.

For example, FIG. 3 shows a magnified view of a facet 12 showing a typical roughness profile of a conventionally manufactured optical PCB 2. FIG. 4 shows the effect this roughness produces on light 8 propagating in the waveguide 8 and exiting the facet 12. The roughness of the surface 14 causes scattering of light 24 as the light exits the waveguide 8, causing in turn the attenuation of the optical signal 22. It should be noted that while FIG. 3 shows an output facet 12, the problem of scattering and attenuation of light affects input facets 12 in a similar way. This loss of light is a major problem to be addressed in the manufacture of optical PCBs 2.

Currently, the most effective method of reducing this loss is manual polishing. However, this method is not very effective. Even using this method, the roughness of the facets 12 can cause over 50% of the total optical link loss in the waveguide. Another known technique for reducing attenuation of light due to facet roughness 14 is to use laser ablation of the waveguide facets 12. However, both these methods are unreliable and unrepeatable. In particular, any damage incurred by these methods will be difficult to correct and therefore using these techniques is likely to significantly impact yield in manufacturing optical PCB technology. These methods are also difficult and costly to apply. What is needed is a repeatable, reliable and low cost method of preparing the exposed input and output facets of the waveguide to reduce scattering at the interface.

In instances where non-free space interfaces are used, i.e. where a component couples directly to a waveguide, it is known to apply an index matching oil or gel onto the interface between the waveguide and component to reduce coupling losses. However, this method is unsuitable for an application requiring repeatable engagement and disengagement of the component to the waveguide as the index matching material would flow out during disengagement and attract and hold contaminants (e.g. dust particles), contaminate other components or simply dry up and cease to be effective when next required.

SUMMARY

According to a first aspect of the present invention, there is provided a method of manufacturing an optical printed circuit board, the method comprising:

providing a support layer having one or more optical waveguides formed on the support layer, the waveguides having exposed interfaces; and, providing a film on one or more of the exposed interfaces, wherein the film has a smoother outer surface than the waveguide interface.

The invention provides a low-cost, repeatable method of creating smooth surfaces on cheaply cut waveguides as part of an optical PCB fabrication process. This counteracts optical scattering loss due the roughness of exposed input and output interfaces (also known as facets) of a PCB embedded optical waveguide. Optical scattering at waveguide facets is currently a major problem in embedded waveguide technology and is often a critical failure mode, as scattering can give rise to over half the entire link loss on an optical channel.

Preferably, the innermost surface of the film conforms to the roughness profile of the waveguide interface. This minimises scattering at the interface between the film and the waveguide.

Preferably, the film has an optical index which matches the optical index of the waveguide to within ±10% of the difference between the waveguide core refractive index and the external environment. The external environment in most cases will be free space (e.g. air).

This helps reduce distortion of the light as it passes from the waveguide to the film. Optical scattering due to surface roughness of the waveguide end facet increases with the difference in refractive index between the waveguide core and the external free space medium outside the waveguide core (typically air). By providing an intermediary refractive index step, this scattering effect is dampened and in the ideal situation whereby the thin film has the same or similar refractive index as the waveguide core, the scattering loss is minimised at the interface between the waveguide core and the film. Being within 10% of said difference is particularly preferred. However, the invention would be advantageous compared with a raw waveguide end facet for percentage differences as large as 30% and even larger depending on the trade-off of loss due to pure roughness, absorption of the film itself (which should be small as the film will be thin) and scattering due to the mismatch in refractive index.

Preferably the film is thin. For example a preferred film can be between 20 μm to 100 μm thick. Nonetheless, a film as thick as 500 μm could be useful depending on said trade-off.

Preferably, the outer surface of the film is at least one order of magnitude smoother than the waveguide interface. This significantly reduces the loss due to scattering, by as much as 3 dB in tests.

Surface roughness is typically expressed in terms of the following parameters denoting the vertical deviations of the surface profile from the mean line:—
  Ra=arithmetic average of absolute values
  Rv=maximum valley depth
  Rp=maximum peak height
  Rq=root mean squared Rq is most typically used to quantify surface roughness. Typical Rq values for cut waveguides range from 600 nm to 200 nm depending on the method used to cut them. Certain more expensive cutting tools such as diamond saws can give much smoother finishes such as Rq values as low as 60 nm. However in many optical printed circuit board applications, such tools cannot be used, for instance when creating waveguide interface points within the board requiring very small slots to be built.

Preferably the outer surface is two, three, four or more orders of magnitude smoother. This greatly reduces scattering as the light exits or enters the waveguide.

This can be done by making the inner surface of the film soft and to some degree viscous so this reduces to a minimum any scattering at the interface between the film and the waveguide interface.

The invention is particularly useful in achieving a smooth waveguide interface in so-called free-space applications, where no component couples directly to the waveguide. A typical example would be a free space lens coupling arrangement whereby a lens system is arranged at a fixed distance away from the output facet of the waveguide. This fixed distance would be required to allow light rays entering or exiting the waveguide to converge into or diverge out of the waveguide according to the focal length requirements of the lens system.

Preferably, the film is preformed before being applied to the exposed interface and the film has a partially viscous inner surface portion that conforms to the roughness profile of the waveguide interface. This allows the profile of the inner surface to "flow" and fill out the uneven profile of the waveguide facet.

Preferably, the film is adhesively applied to the exposed interfaces. This provides a convenient way of applying the film to the facet and securing it into position. The adhesive can also help conform the surface of the film to the roughness profile of the waveguide interface.

Preferably, the film prior to being applied to the interfaces has an adhesive backing. This provides a convenient way of applying the film. By selecting a suitable adhesive, the film can be easily removed and reapplied thus providing a means of significantly increasing optical PCB fabrication yield.

Preferably, there is a plurality of waveguides having coplanar interfaces, the method comprising applying a single piece of film over the plural interfaces.

This simplifies manufacture by allowing multiple waveguide interfaces to be made smooth by the application of a single piece of film in one operation. This is particularly useful where the interfaces are in a localised region on the PCB, e.g. within a few square centimeters. In a typical example, the film may be about 6 mm wide and 2 mm high and the waveguides may be stacked vertically as well as horizontally.

In another embodiment, providing the film comprises:
  coating the waveguide interface with a liquid material;
  applying the surface of a plane member to the liquid material, the plane member being at least partially transparent and smoother than the waveguide interface;
  applying light to the liquid material through the at least partially transparent plane member to cure the material to form said film; and,
  removing the plane member.

This method allows a different way of providing a smooth film on the surface of the waveguide. Rather than applying a preformed film to the facet, a film can be provided by coating the facet with a liquid material, applying a plane member to create the smooth outer surface, and curing the liquid to make it into a solid film. The plane member can then be removed.

The plane member may be coupled to a shield member arranged to shield a portion of the optical printed circuit board from being contaminated by said liquid material. For example, the edge of the optical circuit board may have alignment features or other portions that it is important to keep clear of contamination. The shield member may be constructed and arranged to hold the plane member and to shield the relevant portions of the optical PCB to prevent the liquid material coming into contact with the portions of PCB when the plane member is applied against the liquid material.

In an embodiment, the method comprises attaching a holding frame to the optical printed circuit board, the holding frame being constructed and arranged to help in holding the film in place against the waveguide interface or interfaces.

The frame helps hold the film in place and prevent accidental removal and damage to the film. For example, the frame can be attached to the PCB by any suitable means, such as a clip, fastener or adhesive. Preferably the frame engages the film around the periphery of the film to allow clear access to the waveguide interfaces towards the central portion of the film.

Preferably, the holding frame also stretches the film.

The frame can therefore help prevent wrinkles or other mechanical deformations of the film when in the operational environment.

Preferably, the holding frame is constructed and arranged to provide at least one connector receptacle and/or a lens holder and/or another light coupling device for free-space coupling light to and/or from at least one waveguide.

When free-space coupling light to or from a waveguide, it is of critical importance to achieve the correct separation between the light coupling device and the waveguide facet. Due to the fabrication tolerances inherent to PCBs it is difficult to ensure that this precise distance is maintained. The frame allows a light coupling device to be mounted and the film has a defined and very smooth outer surface, which allow a far better mechanical registration point in the z-axis (along the axis of the waveguides at the interface) compared to prior art techniques.

According to a second aspect of the present invention, there is provided an optical printed circuit board comprising:

a support layer;

on the support layer, one or more optical waveguides having exposed interfaces;

a film provided on one or more of the exposed interfaces, wherein the film has a smoother outer surface than the waveguide interface.

BRIEF DESCRIPTION OF THE DRAWINGS

Examples of the present invention will now be described in detail with reference to the accompanying drawings, in which.

DETAILED DESCRIPTION

Figure 1:
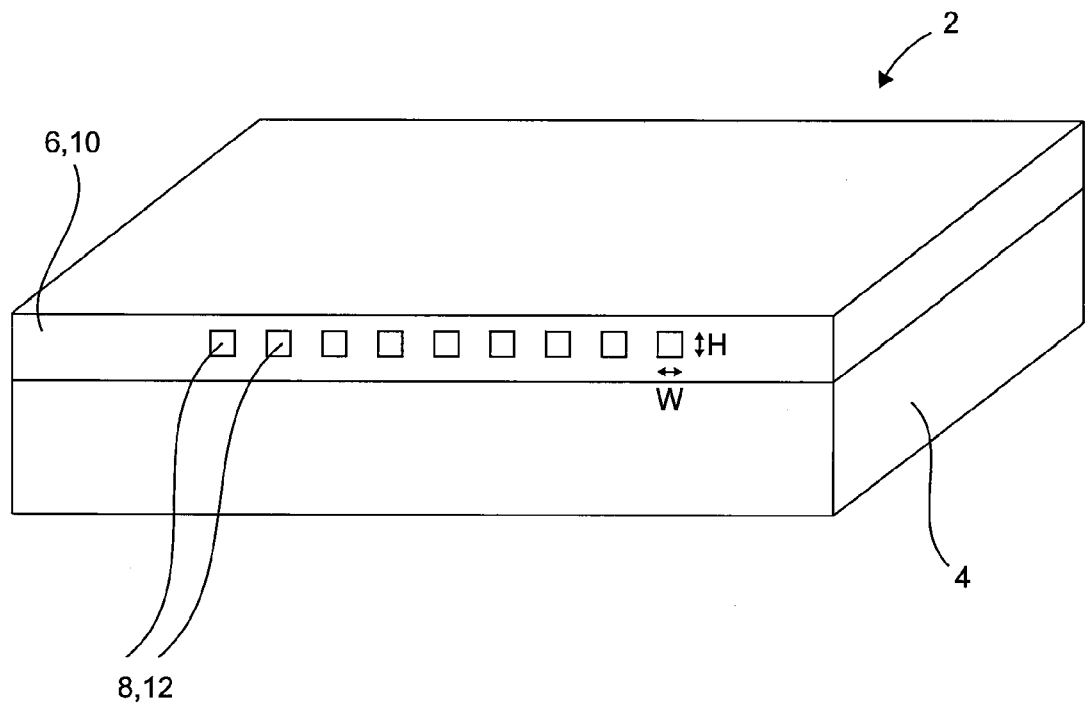
FIG. 1 shows a conventional optical PCB.
Figure 5:
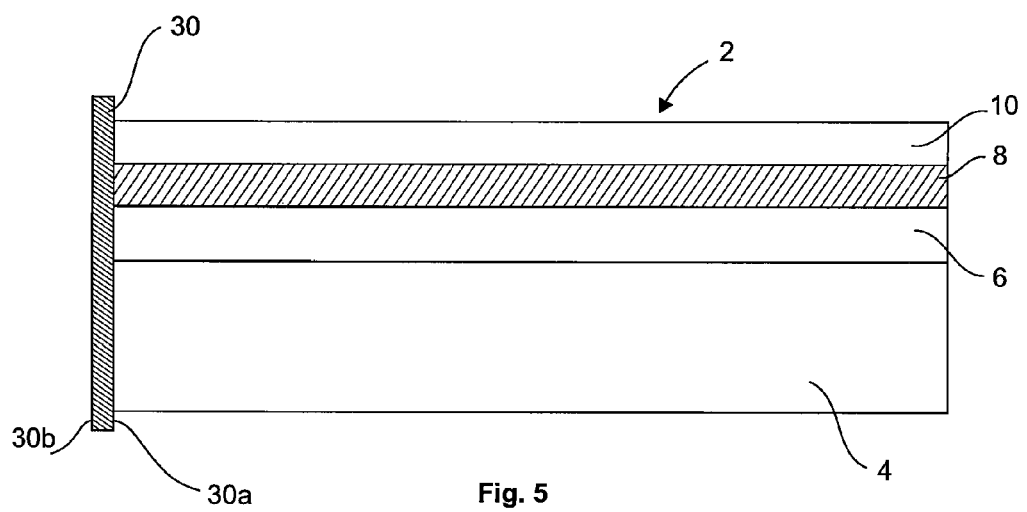
FIG. 5 shows a schematic section through an example of an optical PCB according to an embodiment of the present invention.

FIG. 5 shows a section through an example of an optical PCB 2 according to an embodiment of the present invention. As with the optical PCB shown in FIG. 1, the optical PCB 2 of FIG. 5 comprises a base or support layer 4 on which is arranged a lower cladding layer 6. A plurality of optical waveguides 8 are provided in a higher refractive index core layer on the lower cladding layer 6 (only one being visible in FIG. 5), and are surrounded by an upper cladding layer 10.

The method of manufacture of the optical printed circuit board 2 can be any suitable method. Suitable techniques for manufacturing an optical PCB 2 are well known in the prior art, and so the manufacture of the optical PCB 2 is not discussed in detail herein. Nonetheless, a brief overview of a preferred method is now given.

To manufacture an optical printed circuit board 2 as shown in FIG. 5, initially, a support layer 4 composed of a common PCB material such as FR4 or a flexible laminate material such as polyimide is provided. On the support layer, a lower cladding layer 6 is provided. An optical core layer (from which the optical waveguides 8 will be formed) is then formed on the lower cladding layer 6. Using conventional lithographic techniques and/or other conventional PCB manufacturing techniques, channels of the material of the optical core layer which will eventually form the optical waveguides are formed. These may be formed using any known lithographic techniques. Typically, a layer of a thermally and/or ultra-violet radiation curable liquid polymer such as a polyacrylate or polysiloxane is deposited on the lower cladding layer 6. This is spin coated to ensure uniform deposition of the liquid polymer layer on the lower cladding layer, with the thickness of the layer being controlled by a standard technique such as doctor blading to ensure uniformity of thickness across the layer. A mask is then arranged over the liquid polymer layer and ultra-violet radiation is used to cure the exposed structure. Alternatively some polymers can be thermally cured, in some cases in combination with ultra-violet radiation. The mask is then removed and the uncured (still liquid) material is removed. This leaves a pattern of channels that will later form the optical waveguides 8. The upper cladding layer 10 is then applied.

As well as lithographic techniques, other techniques can be used in any or all of the steps of forming the optical PCB. Examples include direct laser writing, direct electron beam writing, laser ablation, embossing, ink jet printing or micro jet printing.

The upper cladding layer 10 may be applied and either uniformly cured to provide a uniform unstructured upper cladding or, for some applications, structured using a second mask. For example, a curable polymer may be provided in liquid form and then a second mask may be used to selectively form a solid upper cladding layer in desired regions. The tolerance required for the formation of the upper cladding layer is typically significantly lower than that required for the formation of the waveguides and alignment features or projections. A more detailed description of a suitable technique is disclosed in the co-owned US patent application published as US-A-2009-0162004, the contents of which are hereby incorporated by reference.

Figure 2:
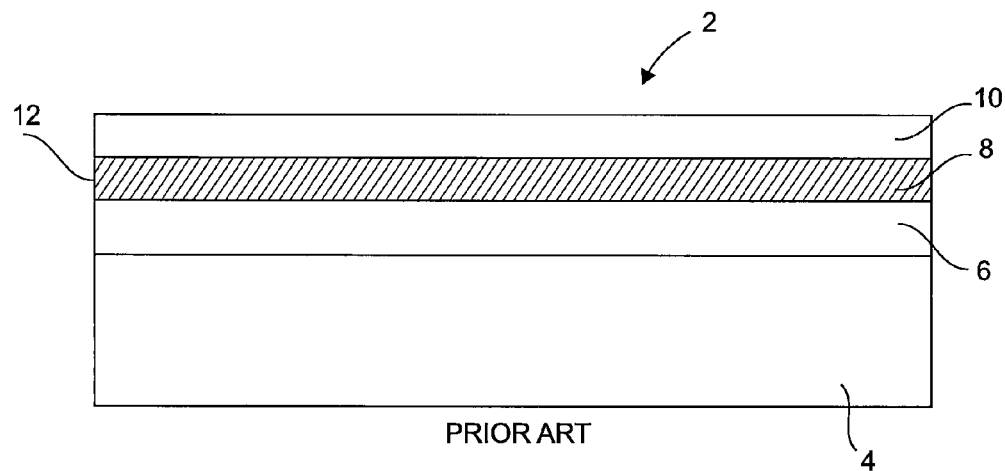
FIG. 2 shows schematic section through the optical PCB of FIG. 1.

Clearly, many of the techniques used in the manufacture of layered products such as the optical PCB shown in FIG. 2 are known. A more detailed description will therefore not be provided.

A film 30 is applied over the end of the optical PCB 2. The film 30 is a thin, adhesive-backed strip allowing it to be easily stuck over the exposed planar waveguide interface 12. The film 30 has a refractive index matching that of the waveguide core 8 to preferably within ±10% of the difference in refractive index between the waveguide core and the free space medium (which is typically air), and more preferably within ±1% of this difference. Preferably the film 30 will be comprised of the same material as the waveguide 8, which is especially useful if the waveguide 8 is polymer.

Figure 6:
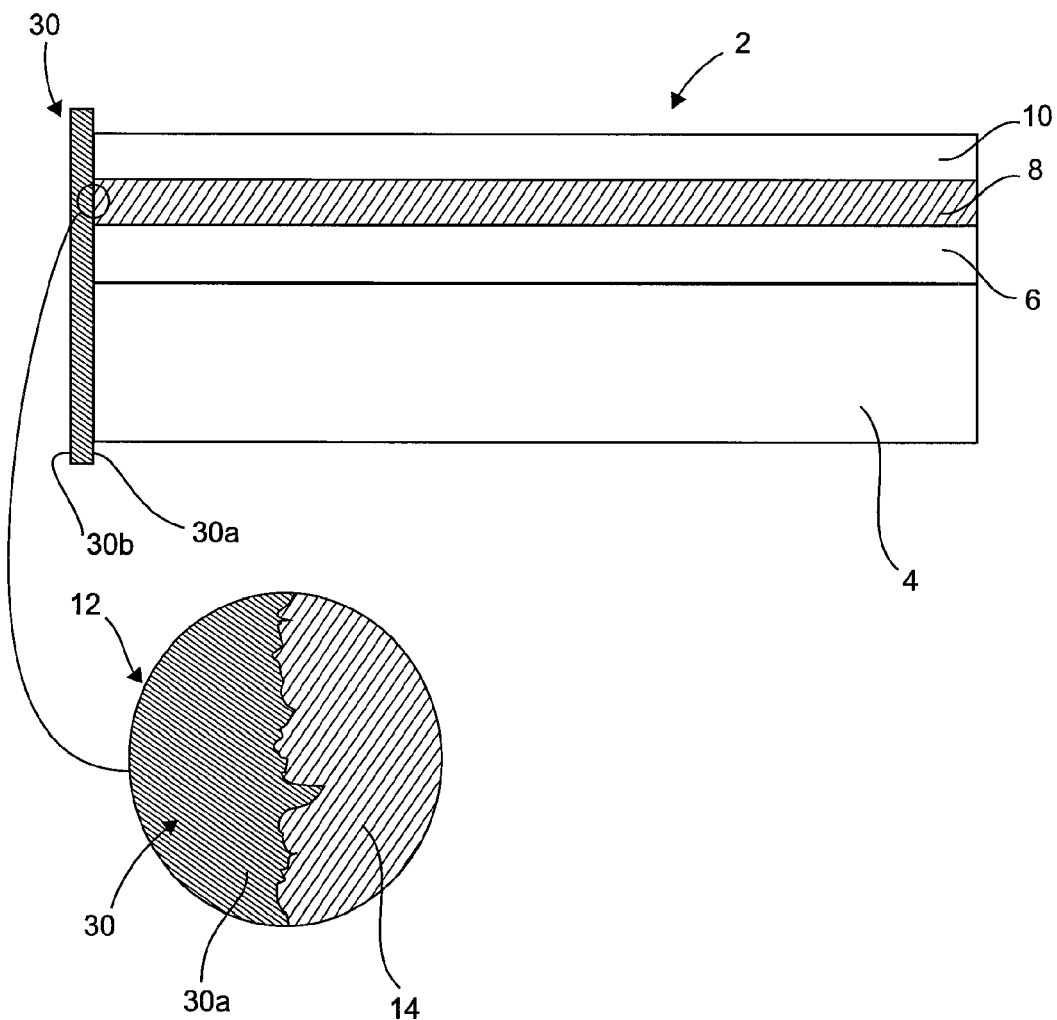
FIG. 6 shows a detail view of FIG. 5.
Figure 7:
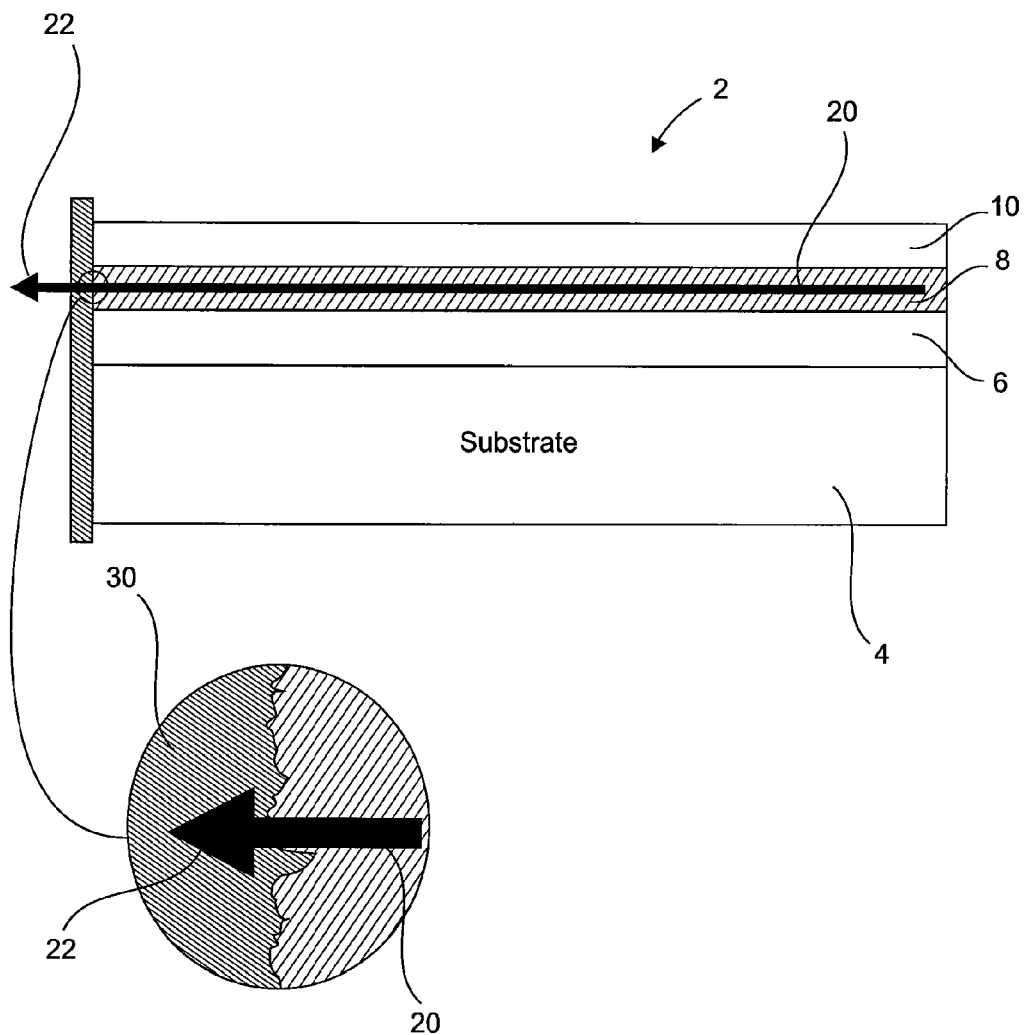
FIG. 7 shows light propagating in the optical PCB of FIG. 5.

As shown in FIG. 6, the soft, partially viscous texture of the film 30 on the adhesive backed side 30a will effectively fill in the rough profile 14 of the cut waveguides 8 and eliminate scattering at this interface 12. The outer surface 30b of the film 30 will preferably be over an order of magnitude smoother than that of a typically polished or laser ablated waveguide end facet 12 and will therefore significantly reduce scattering loss in these areas, as shown by FIG. 7.

Figure 4:
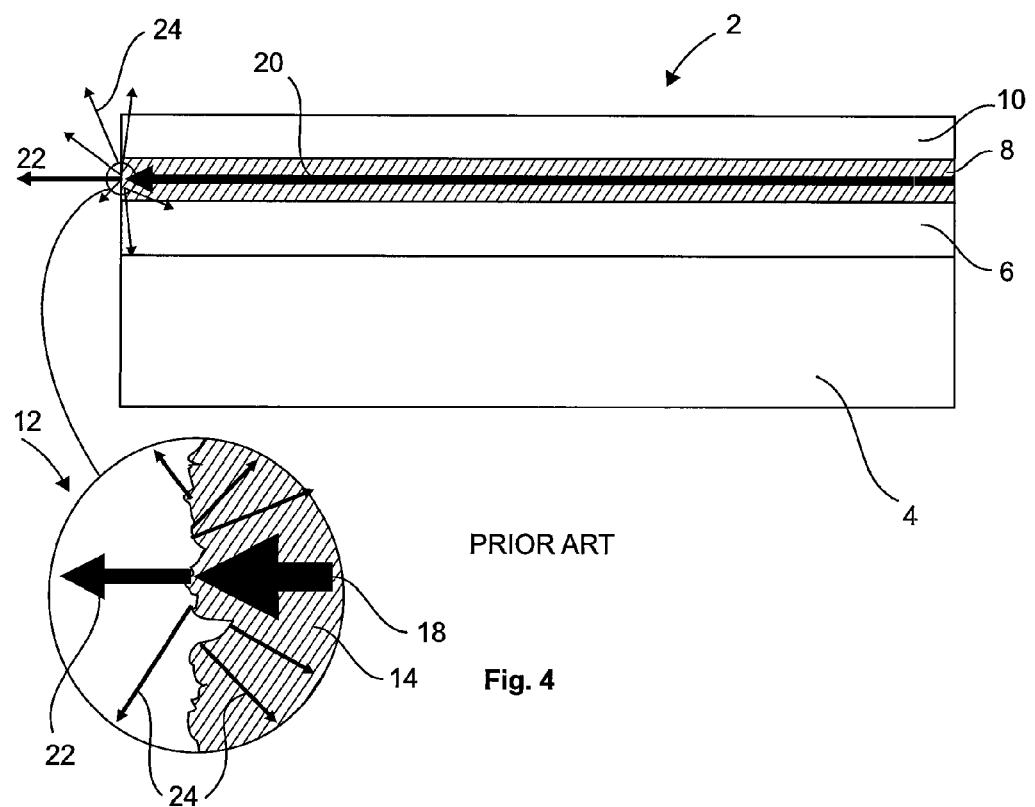
FIG. 4 shows light propagating in the optical PCB of FIG. 1.
Figure 8:
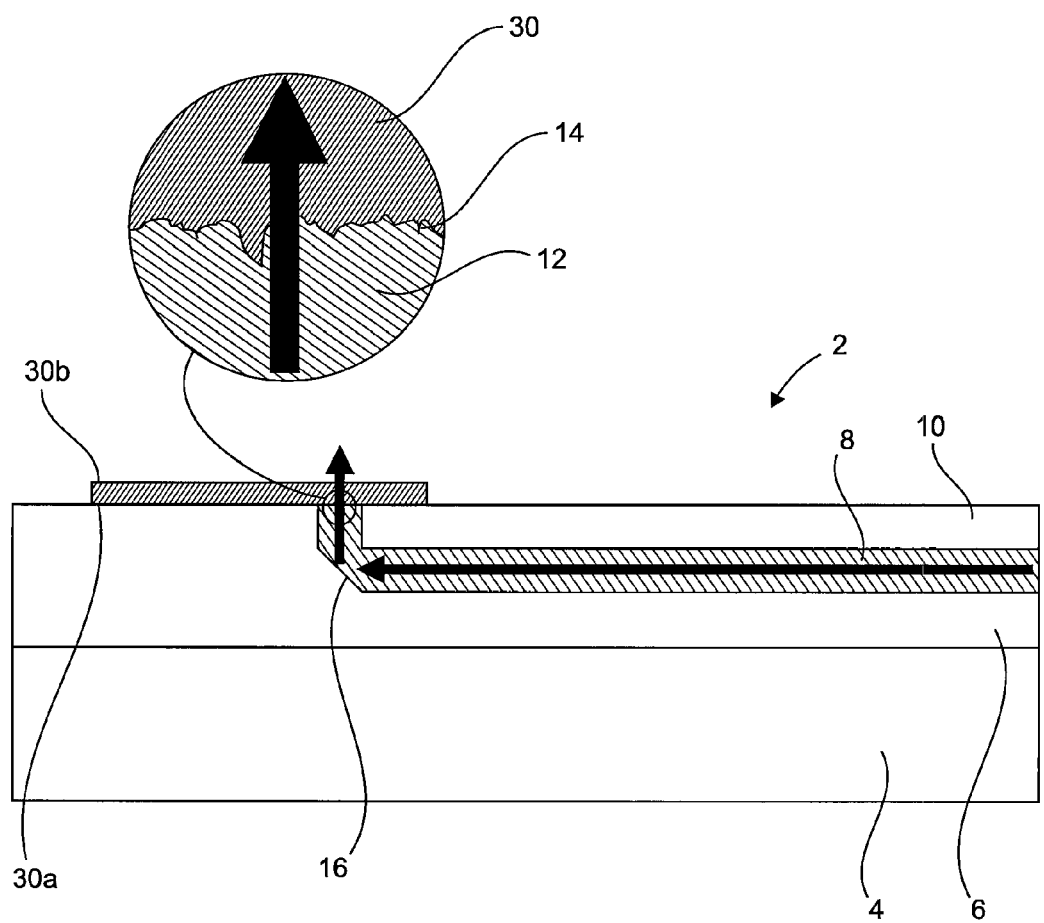
FIG. 8 shows an example of an optical PCB having an out-of-plane facet in accordance with an embodiment of the present invention.

Thus, this technique damps or eliminates scattering of propagating light at the waveguide end facet 12. Although FIG. 4 shows scattering of light exiting the waveguides 8, the same principle applies to light entering the waveguides 8. Similarly, although FIGS. 6 and 7 show an in-plane facet 12, the invention is applicable to out-of-plane facets 12 also. FIG. 8 shows an example of an optical PCB 2 having an out-of-plane facet 12. As can be seen, the waveguide 8 runs parallel to the plane of substrate until near its end, at which point it extends out of plane and terminates at the top surface of the upper cladding layer 10. An angled portion 16 of the waveguide 12 reflects the light between the in-plane and the out-of-plane portions of the waveguide 8. A film 30 is applied over waveguide facet 12.

Suitable adhesive-backed index matching film is for example manufactured by Japanese company "Tomoegawa" (http://www.tomoegawa.co.jp/english/).

As well as providing a low cost and improved processing for finishing a waveguide 8, the solution is also less prone to damage the waveguide 8 compared with the precarious techniques currently used in the manufacture of optical PCBs 2, namely the correct surface finish by polishing or such line of all in-plane or out-of-plane waveguides 8. Thus the preferred embodiments of the present invention improve yield when manufacturing optical PCBs 2.

Figure 9:
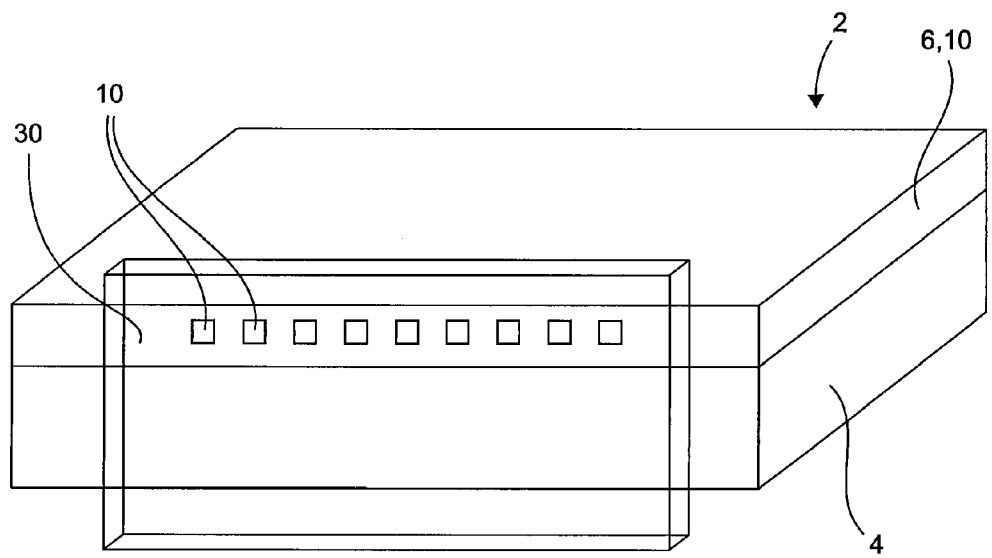
FIG. 9 shows an orthographic view of the PCB of FIG. 5.

Discrete films 30 can be applied to each of the various waveguide facets 12. Alternatively, as shown in FIG. 9, a continuous section of film 30 can be applied across a plurality of waveguide ends having coplanar facets 12 in a localised region. This improves efficiency of applying the films 30 to the facets 12 and reduces material and assembly cost.

Preferably the film 30 will be replaceable, e.g. by choosing a film 30 with a suitable adhesive. This allows a film to be removed and a new film 30 to be applied in its place. This can be helpful in the situation where the previous film 30 is damaged or worn. In the prior art, there is no practicable way of repairing a damaged end of a waveguide 8.

Figure 10:
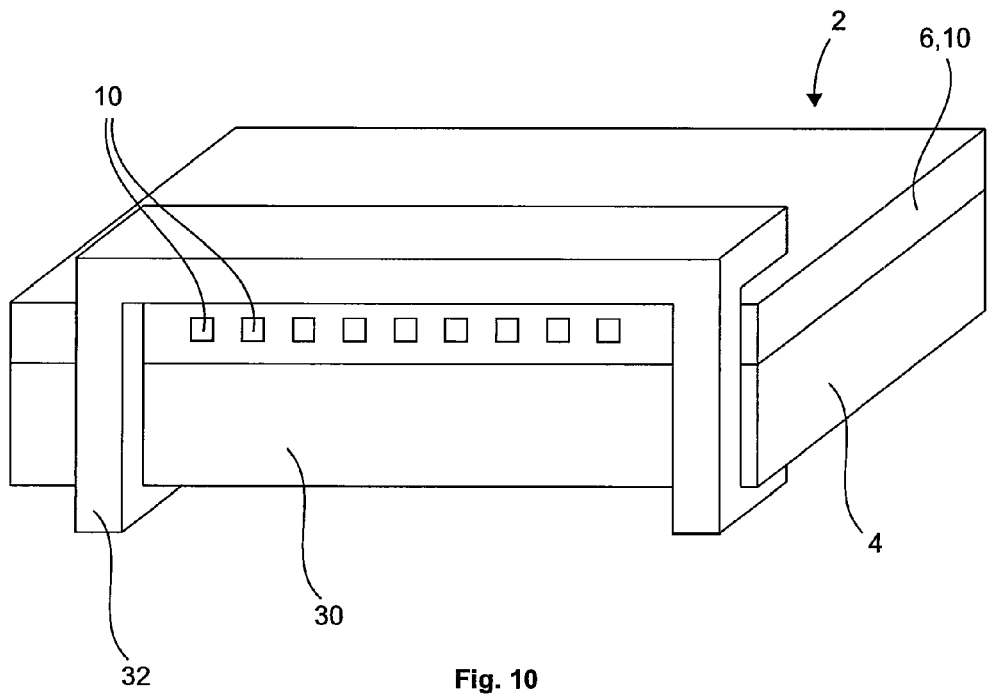
FIG. 10 shows a frame for use with the PCB of FIG. 5.

Referring now to FIG. 10, in a preferred embodiment, a holding frame 32 will be attached to the PCB 2 over the adhesive film 30 to hold the film 30 in place. The frame 32 may attach to the PCB 2 by any suitable means, e.g. clip, fastener, adhesive etc, and contacts the film 30 around some or all of its periphery to hold it in place. This helps guard against accidental removal of the film 30 and/or damage to the film 30. The frame 32 may also hold the film 30 taut in order to help prevent wrinkles or other mechanical deformations developing in the film 30 when the PCB 2 is deployed in an operational environment.

In typical optical PCB 2 applications a mechanical receptacle is usually applied around the waveguides to accommodate pluggable connectors. This receptacle may also incorporate a lens array, which is held at a precise distance away from the waveguides as part of a free space coupling scheme. Due to the fabrication tolerances inherent to a PCB 2, it is difficult to ensure that this precise distance is maintained.

Figure 11:
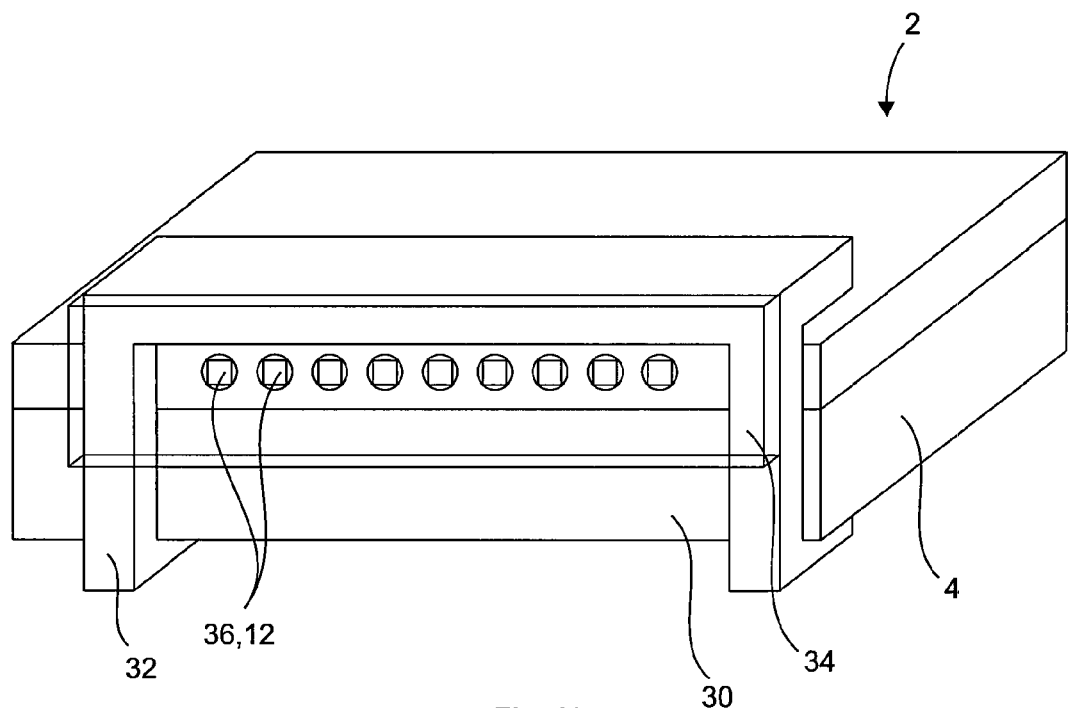
FIG. 11 shows an example of an optical PCB having a lens array in accordance with the present invention.
Figure 12:
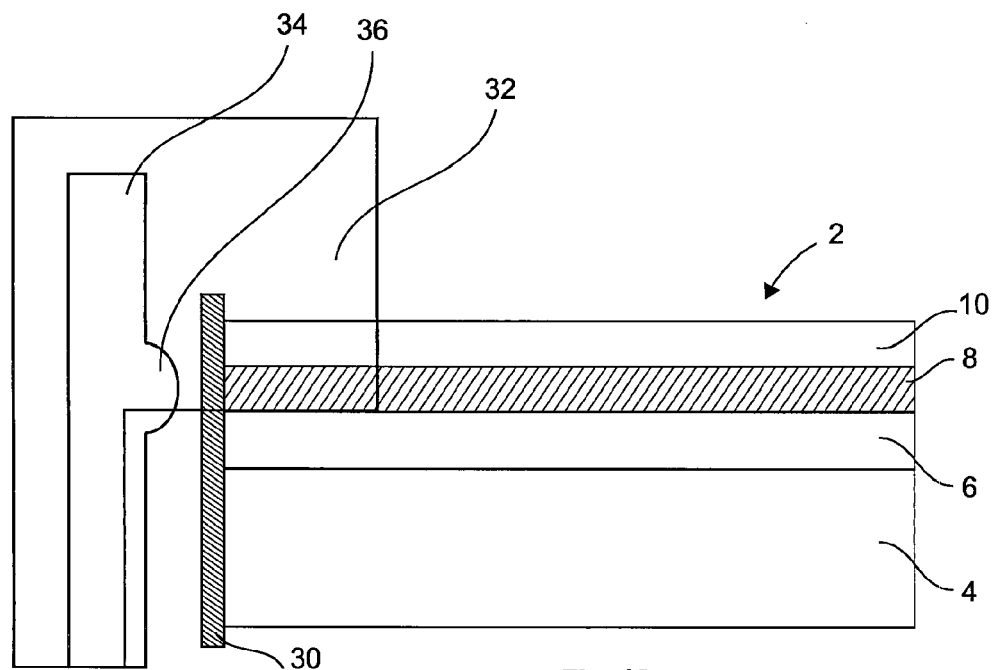
FIG. 12 shows a cross section view of FIG. 11.

The preferred holder 32 can also include a connector receptacle and/or lens holder as part of a free-space coupling arrangement. FIG. 11 shows a preferred holding frame 32 to which is attached a lens plate 34 in which is formed an array of lenses 36. The lenses 36 are aligned with the waveguide facets 12 so as to be able to couple light into and/or out of the waveguides. FIG. 12 shows the holding frame 32 and lens array 36 in cross section. As the waveguide film 30 has a defined and very smooth outer surface 30b, the holding frame 32 serves as a far better mechanical registration point in the z-axis (along the axis of the waveguides at the interface) to allow accurate coupling of light into and out of the waveguides 8.

Figure 13:
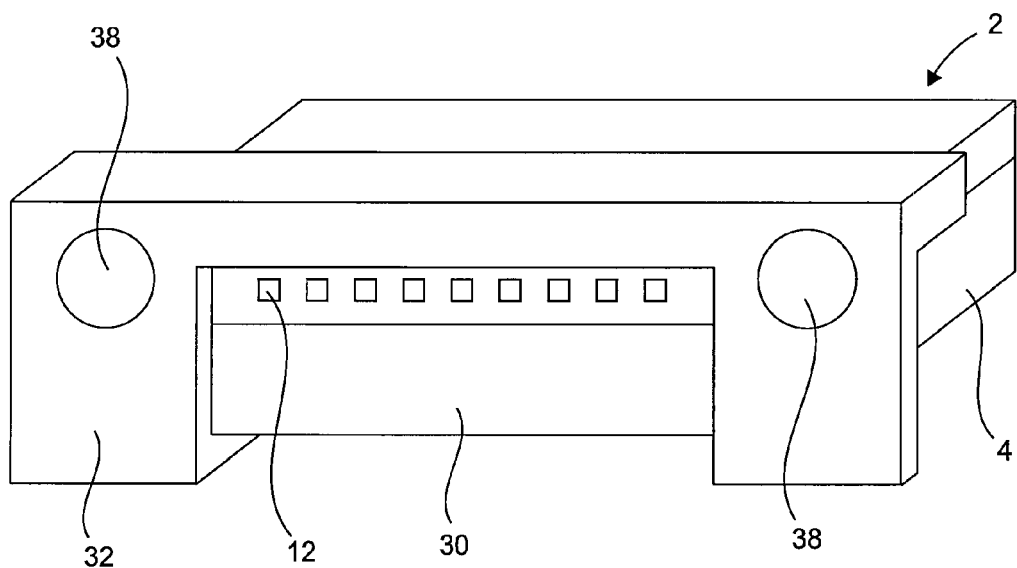
FIG. 13 shows an example of an optical PCB having a connector slot in accordance with the present invention.
Figure 14:
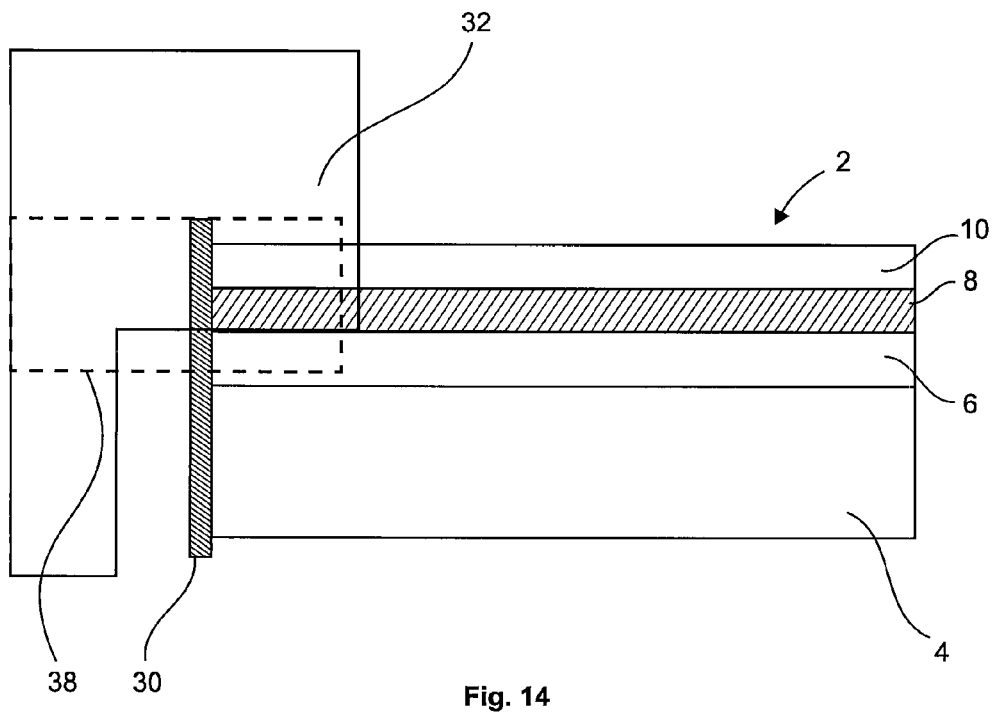
FIG. 14 shows a cross section view of FIG. 13.

FIG. 13 shows an embodiment where the holding frame 32 has connector slots 38 or other attachment means by which connectors can be attached to the optical PCB 2. FIG. 14 shows this arrangement in cross section. The connectors can be attached to allow light to be coupled to and from the waveguides 8. Again, using the holding frame 32 allows accurate alignment of the connectors and the waveguide facets 12.

Figure 15:
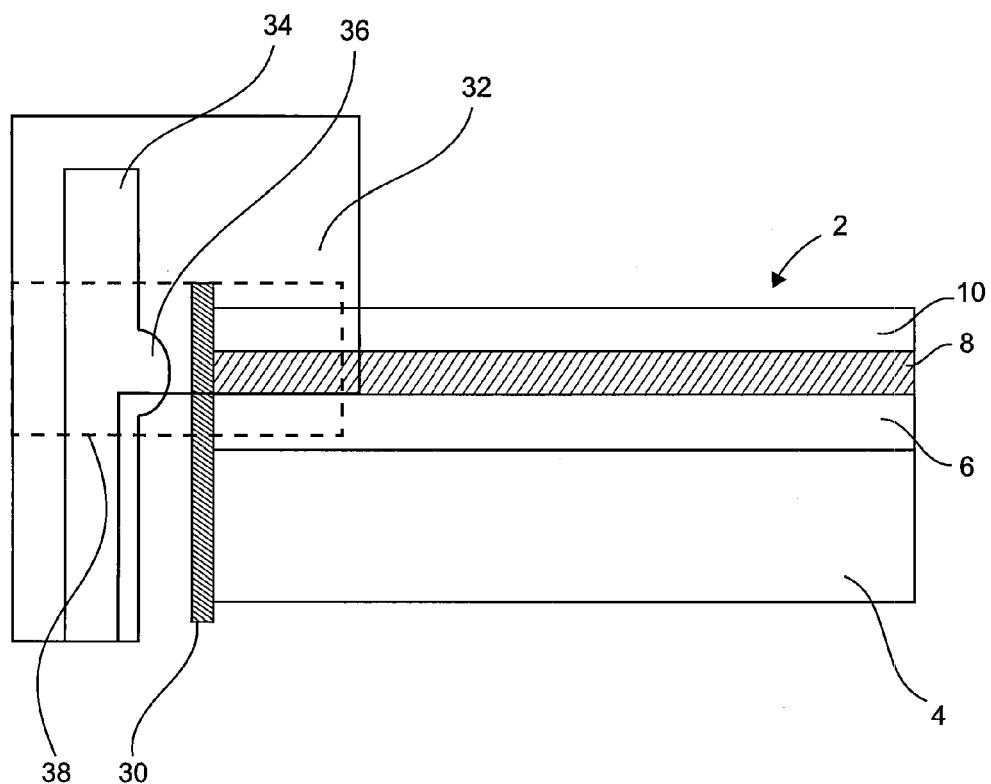
FIG. 15 shows a cross section view of an example of an optical PCB having a lens array and a connector slot in accordance with the present invention.

FIG. 15 shows a holding frame 32 which supports a lens plate 34 and has connector slots 38 to allow connectors to be attached to the optical PCB 2 to accurately couple light to and from the lens array 36 and thus to the waveguides 8.

Figure 3:
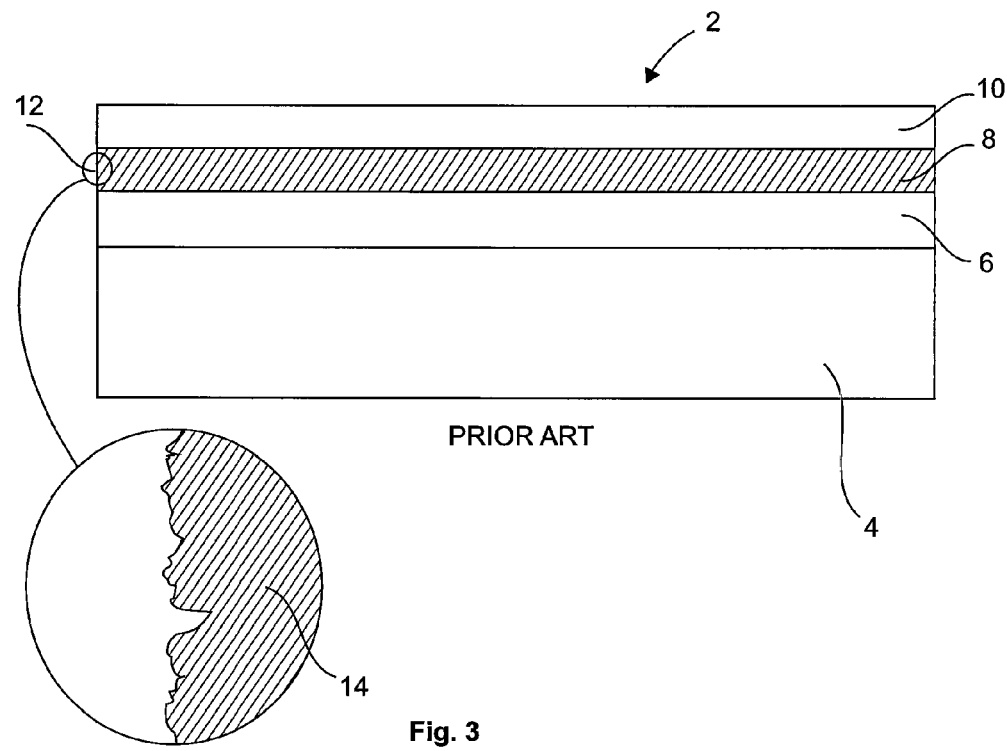
FIG. 3 shows a detail view of FIG. 2.
Figure 16:
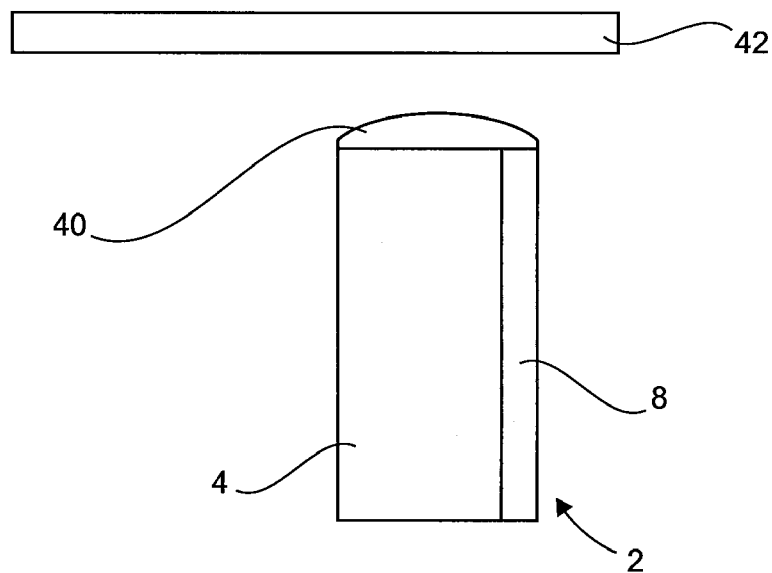
FIGS. 16 to 19 show another example of a method of providing a film to a waveguide facet in accordance with an embodiment of the present invention.
Figure 17:
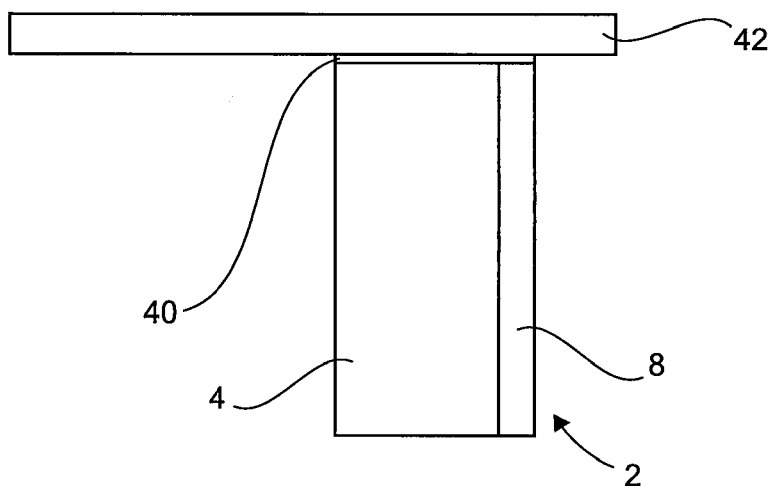
Figure 18:
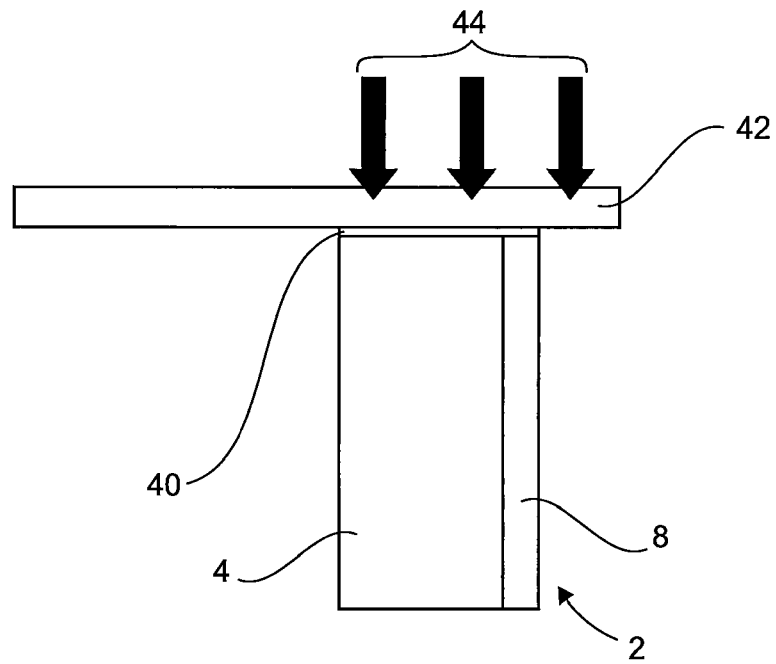
Figure 19:
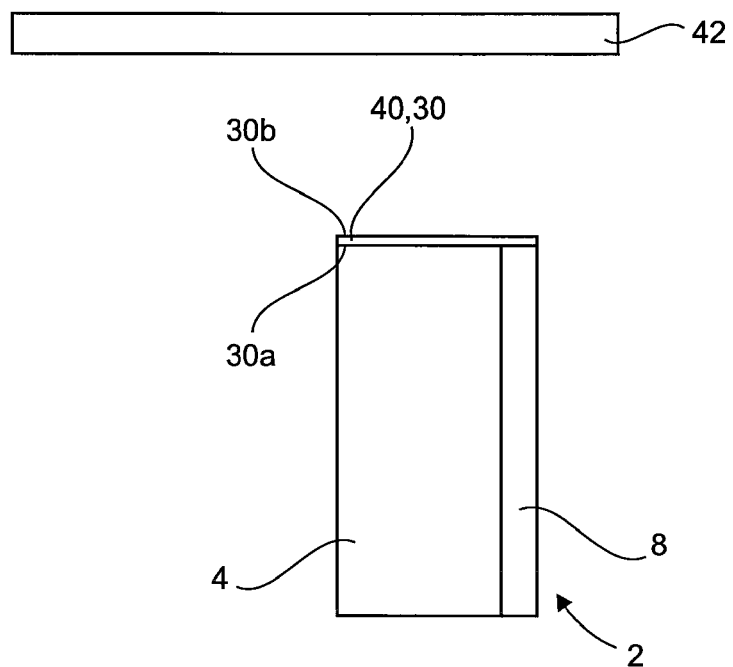

FIGS. 16 to 19 show another example of a method for providing a film on a waveguide facet 12 in accordance with an embodiment of the present invention. First, as shown in FIG. 16, a liquid UV curable index matching material 40 is applied to the waveguide end facet 12. As shown in FIG. 17, this is then pressed down into a thin film by a transparent plane 42 with a very smooth surface e.g. a glass slide. The liquid material 40 flows into and fills the troughs of the rough surface of the facet 12 (for example the rough surface 14 shown in FIG. 3). As shown in FIG. 18, the material 40 is then exposed to UV light through the transparent plane 42 causing it to be cured. After curing, as shown in FIG. 19, the transparent plane 42 is removed leaving a hard permanent film 30 with a surface roughness on the outer surface 30b similar to that of the transparent plane 42. Accordingly a transparent plane 42 should be chosen with a surface roughness at least an order of magnitude less than that of the waveguide facet 12.

Preferably a release agent is applied to the transparent plane 42 before being applied to the liquid material 40 to prevent the material 40 sticking to the transparent plane 42 during the curing process, allowing the transparent plane 42 to be removed after curing and leaving negligible distortion to the outer surface of the cured film 30.

Preferably the index matching material 40 is the same material as the waveguide core 8 itself. This is practical in cases where the waveguide core 8 is a liquid UV curable polymer. In any case, preferably the film 30 has an optical index which matches the optical index of the waveguide 8 to within ±10% of the difference between the waveguide core 8 refractive index and the external environment, e.g. air.

This provides a film 30 on the facet 12 which has a similar effect to the film 30 described in relation to FIGS. 5 to 7 in reducing scattering loss at the waveguide facet 12 by providing a smooth surface at the outer surface of the film 30. This technique has been found to reduce scattering losses by 3 dB.

In some applications, the upper cladding layer 10 will also be structured to create trenches around exposed waveguide core sections allowing passive mechanical registration such as described in co-pending patent US-A-2009-0162004. It is important that when applying the index matching material 40 these trenches are left completely uncontaminated. This may prove to be difficult as the trenches are in very close proximity to the waveguide facets 12 so potentially there is a risk from the uncured liquid from flowing into them.

Figure 20:
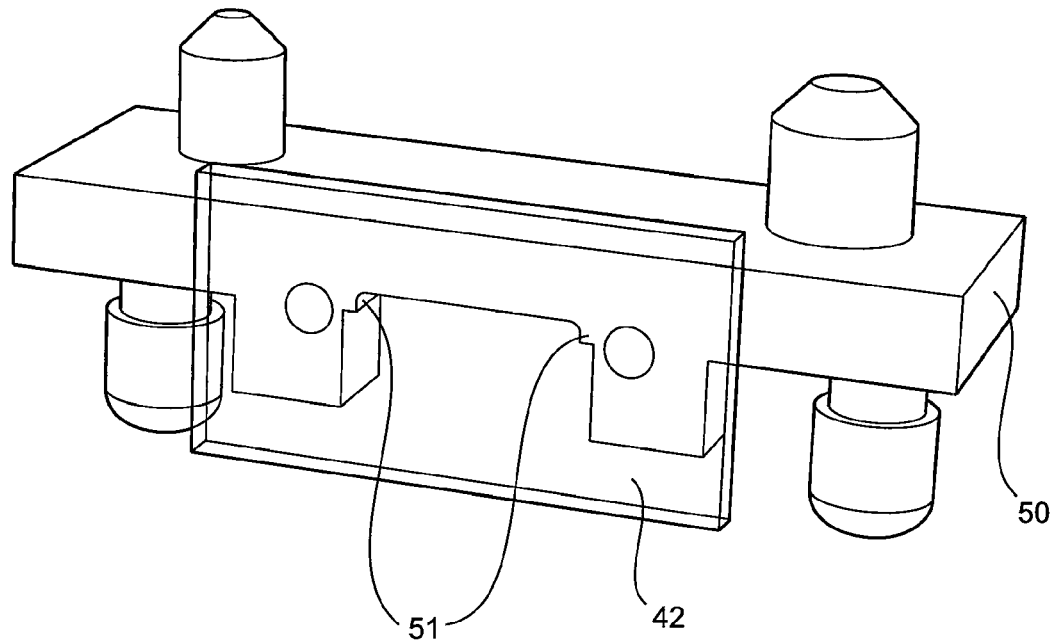
FIGS. 20 and 21 show from the front and the rear an example of a slide holder for use with an embodiment of the present invention.
Figure 21:
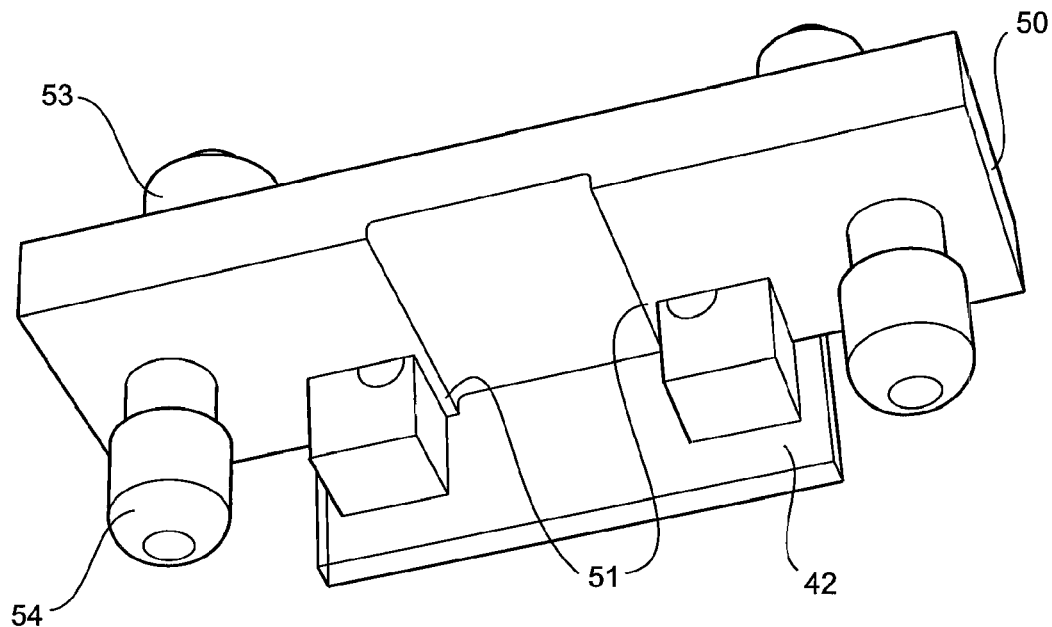
Figure 22:
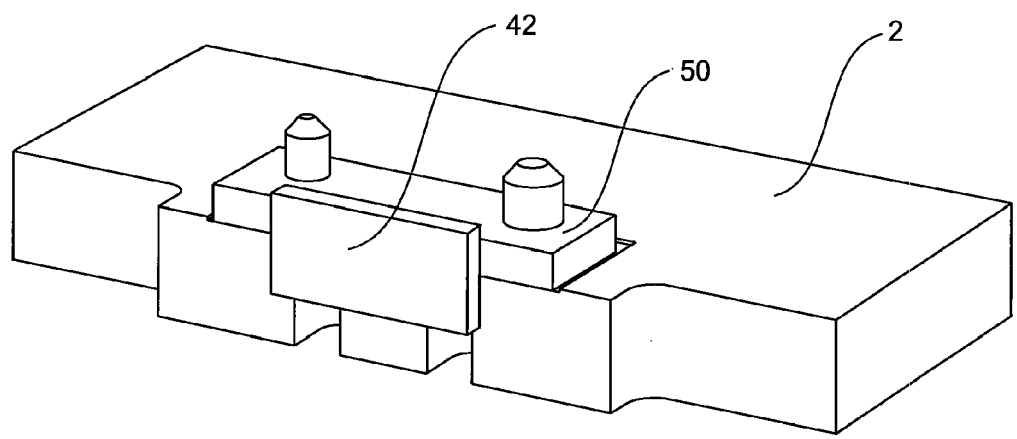
FIG. 22 shows the slide holder of FIGS. 20 and 21 applied to an optical PCB and FIG. 23 shows a cross section of this arrangement; and, FIGS. 24 to 27 show an example of a method of providing a film to a waveguide facet using the slide holder of FIGS. 20 and 21 in accordance with an embodiment of the present invention.
Figure 23:
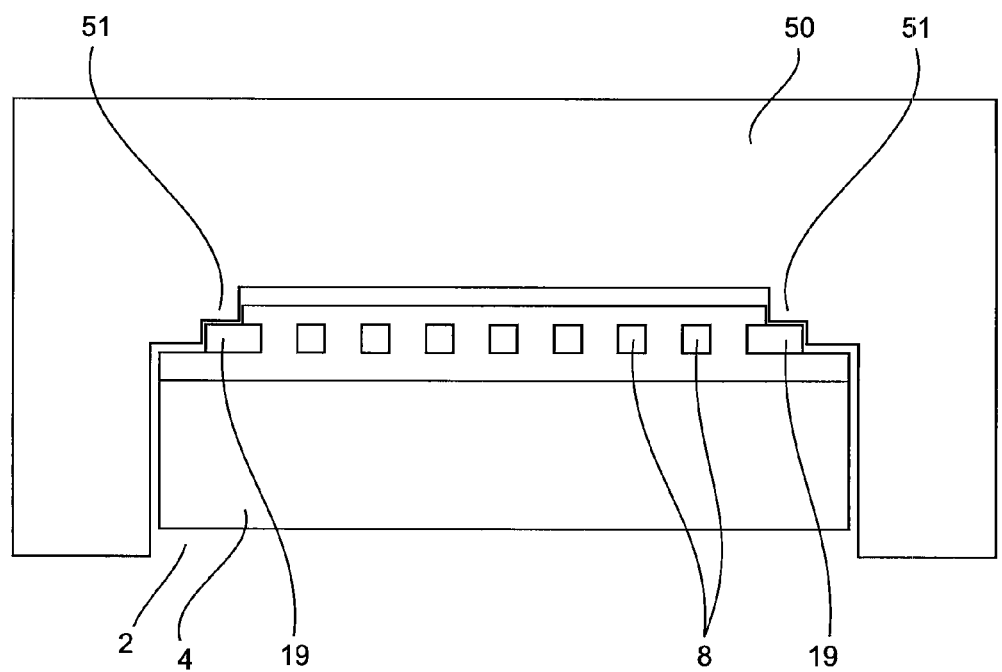
Figure 24:
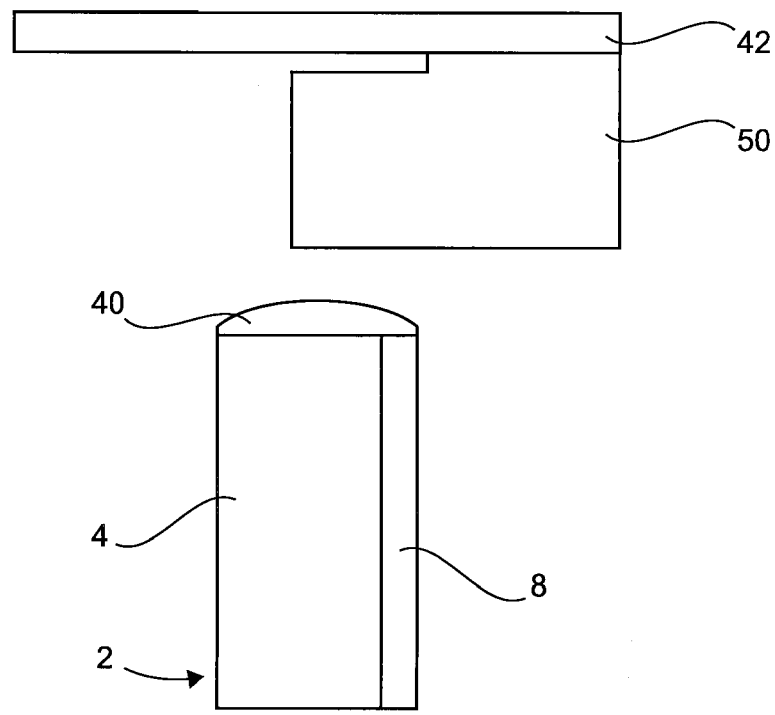
Figure 25:
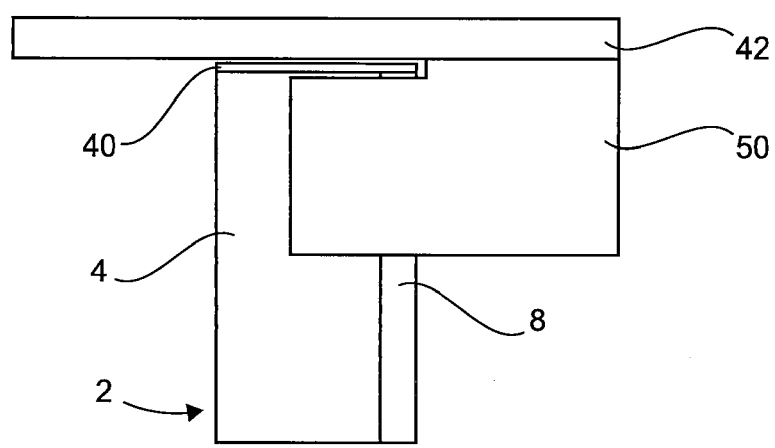
Figure 26:
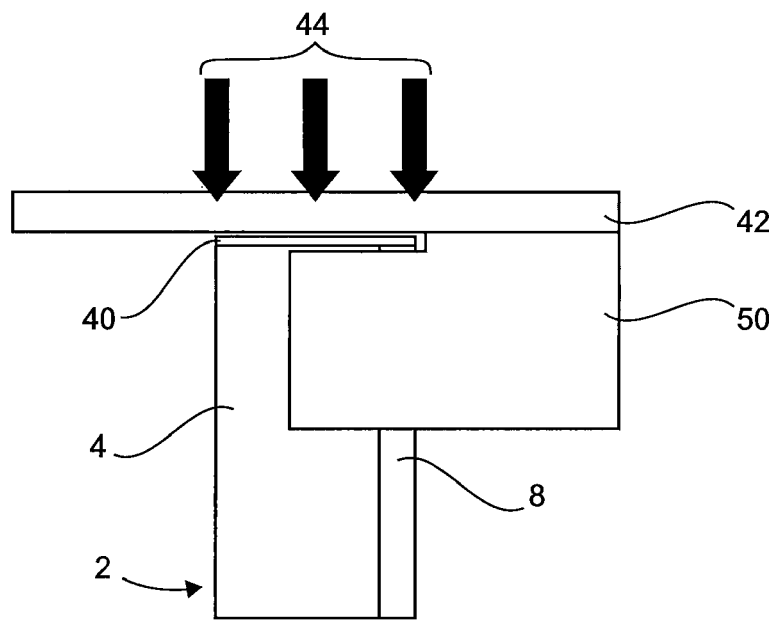
Figure 27:
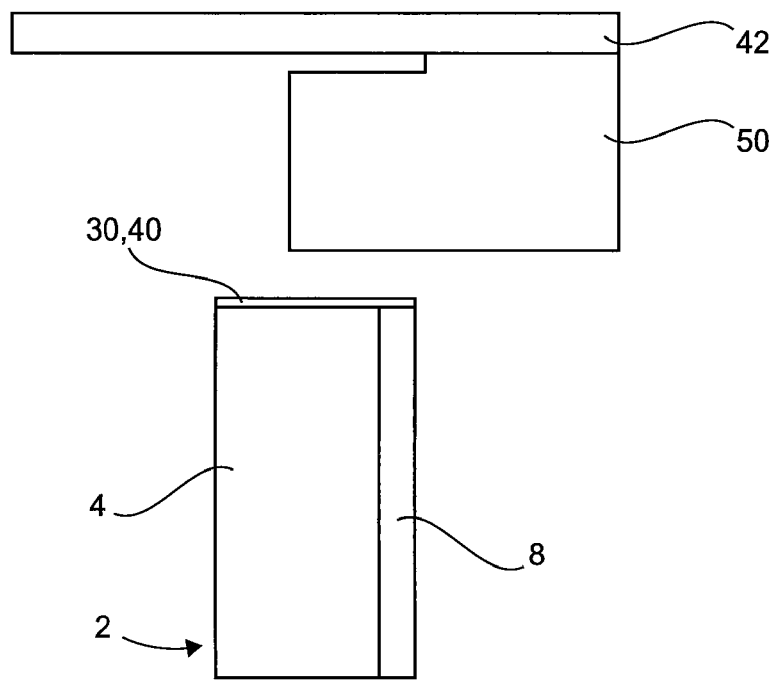

To address this, in a preferred embodiment, a removable passive component is provided to fit into the trenches, filling them and preventing the uncured liquid from flowing into them. Preferably the passive component also holds the transparent plane 42 allowing convenient and repeatable application of this technique. For example, FIGS. 20 and 21 show a suitable plane holder 50 from the front and from the rear respectively. FIG. 22 shows the plane holder 50 and transparent plane 42 applied to an optical PCB 2 and FIG. 23 shows this in cross section. As can be seen, shaped projections 51 on the plane holder 50 fit into the trenches 19 on the PCB 2, thereby aligning the holder 50 with the PCB 2 and also shielding the trenches 19 from the uncured liquid.

FIGS. 24 to 27 show a film 30 being provided on the waveguide facet 12 using the same method as shown by FIGS. 16 to 19 with the plane holder 50 being used to shield the trenches 19.

Embodiments of the present invention have been described with particular reference to the examples illustrated. However, it will be appreciated that variations and modifications may be made to the examples described within the scope of the present invention.

The invention claimed is:

1. A method of manufacturing an optical printed circuit board, the method comprising:
    providing a support layer having one or more optical waveguides formed on the support layer, the optical waveguides having exposed interfaces with root mean squared surface roughness (Rq) values greater than or equal to about 60 nm; and,
    adhesively applying a film on one or more of the exposed interfaces, wherein the film is preformed before being applied to the exposed interface, the film having:
    an inner surface portion that is at least partially viscous and conforms to the exposed interface of the optical waveguide,
    an outer surface portion that is smoother than the exposed interface, and
    an adhesive backing for adhering the film to the exposed interface.

2. A method according to claim 1, wherein the film has an optical index which matches the optical index of the optical waveguide to within ±10% of the difference between a refractive index of the optical waveguide core and that of an external environment.

3. A method according to claim 1, wherein the outer surface portion of the film is at least one order of magnitude smoother than the exposed interface.

4. A method according to claim 1, wherein there is a plurality of waveguides having coplanar interfaces, the method comprising applying a single piece of film over the coplanar interfaces.

5. A method according to claim 1, comprising attaching a holding frame to the optical printed circuit board, the holding frame being constructed and arranged to help in holding the film in place against the waveguide interface or interfaces.

6. A method according to claim 5, wherein the holding frame applies a tension to the film to keep it taut.

7. A method according to claim 5, wherein the holding frame is constructed and arranged to provide at least one of: a connector receptacle, a lens, and another light coupling device, each for free-space coupling light in connection with at least one waveguide.

8. A method according to claim 1, wherein the film is removable.

9. A method according to claim 8, comprising removing an existing film from the exposed interface before applying a replacement film to the exposed interface.

10. A method according to claim 1, wherein the exposed interface has a root mean squared surface roughness (Rq) values greater than or equal to about 200 nm.

11. A method of manufacturing an optical printed circuit board, the method comprising:
    providing a support layer having one or more optical waveguides formed on the support layer, the optical waveguides having waveguide interfaces that are exposed with root mean squared surface roughness (Rq) values greater than or equal to about 60 nm; and,
    providing a film on one or more of the waveguide interfaces, wherein the film has an outer surface smoother than the waveguide interface, and providing the film comprises:
    coating the waveguide interface with a liquid material;
    applying a surface of a plane member to the liquid material, the plane member being at least partially transparent and smoother than the waveguide interface;
    applying light to the liquid material through the at least partially transparent plane member to cure the material to form the film; and,
    removing the plane member.

12. A method according to claim 11, wherein the plane member is coupled to a shield member arranged to shield a portion of the printed circuit board from being contaminated by the liquid material.

13. A method according to claim 11, wherein the exposed interface has a root mean squared roughness (Rq) values greater than or equal to about 200 nm.

14. An optical printed circuit board comprising:
    a support layer;
    on the support layer, one or more optical waveguides having exposed interfaces with root mean squared surface roughness (Rq) values greater than or equal to about 60 nm; and
    a film adhesively applied to one or more of the exposed interfaces, wherein the film is preformed before being applied to the exposed interface and has:
    an innermost surface that is at least partially viscous and conforms to the exposed interfaces of the one or more optical waveguides,
    an outer surface smoother than the exposed interface, and
    an adhesive backing that adheres the film to the exposed interface.

15. An optical printed circuit board according to claim 14, wherein the film has an optical index which matches the optical index of the waveguide to within ±10% of a difference between a refractive index of the waveguide core and that of an external environment.

16. An optical printed circuit board according to claim 14, wherein the outer surface of the film is at least one order of magnitude smoother than the exposed interface.

17. An optical printed circuit board according to claim 14, wherein there are a plurality of waveguides having coplanar interfaces and a single piece of film is applied over the coplanar interfaces.

18. An optical printed circuit board according to claim 14, comprising a holding frame attached to the optical printed circuit board, the holding frame being constructed and arranged to help in holding the film in place against the exposed interface or interfaces.

19. An optical printed circuit board according to claim 18, wherein the holding frame also stretches the film.

20. An optical printed circuit board according to claim 18, wherein the holding frame is constructed and arranged to provide at least one of: a connector receptacle, a lens, and another light coupling device for coupling light with respect to at least one waveguide.

21. An optical printed circuit board according to claim 14, wherein the exposed interface has a root mean squared roughness (Rq) values greater than or equal to about 200 nm.

* * * * *